United States Patent [19]

Muller et al.

[11] Patent Number: 5,285,131
[45] Date of Patent: Feb. 8, 1994

[54] VACUUM-SEALED SILICON INCANDESCENT LIGHT

[75] Inventors: Richard S. Muller, Kensington; Carlos H. Mastrangelo, Oakland, both of Calif.

[73] Assignee: University of California - Berkeley, Oakland, Calif.

[21] Appl. No.: 621,678

[22] Filed: Dec. 3, 1990

[51] Int. Cl.$^5$ .......................... H01K 1/02; H01K 1/28; H01K 1/50
[52] U.S. Cl. .................... 313/578; 313/315; 313/495; 313/580; 313/634; 313/636
[58] Field of Search ............... 313/578, 580, 634, 636, 313/522, 495, 633, 315, 317, 324

[56] References Cited

U.S. PATENT DOCUMENTS

| | | | |
|---|---|---|---|
| 1,925,857 | 9/1933 | Van Liempt | 313/578 |
| 4,455,561 | 6/1984 | Boyden et al. | 313/420 X |
| 4,724,356 | 2/1988 | Daehler | 313/522 |
| 4,749,443 | 6/1988 | Mitchell et al. | 156/653 |

OTHER PUBLICATIONS

"Performance and Design Considerations of the Thin-Film Tungsten Matrix Display," Paul M. Alt and Peter Pleshko, *IEEE Transactions on Electron Devices*, vol. Ed-20, No. 11, Nov., 1973.

"A Thin-Film Integrated Incandescent Display," Frederick Hochberg, Hugo K. Seitz and Alan V. Brown, *IEEE Transactions On Electron Devices*, vol. ED-20, No. 11, Nov. 1973.

"Integrated Transducers Based on Blackbody Radiation from Heated Polysilicon Filaments," H. Guckel and D. W. Burns, Wisconsin Center for Applied Microelectronics, University of Wisconsin, Madison, Wisconsin. Dec. 1985.

"Integrated-Circuit Broadband Infrared Sources," G. Lamb, M. Jhabvala and A. Burgess of Goddard Space Flight Center, *NASA Tech Briefs*, Mar. 1989.

"Lightly Doped Polysilicon Bridge as an Anemometer," Yu-Chong Tai and Richard S. Muller, Berkeley Integrated Sensor Center, *Transducers'87*. Dec. 1987.

"Micro-Diaphragm Pressure Sensor," S. Sugiyama, T. Suzuki et al., Toyota Central Research & Development Lab., Inc., *Rec. of the IEEE Int. Electron Devices Meeting*, 1986, pp. 184–187. Dec. 1986.

*Primary Examiner*—Donald J. Yusko
*Assistant Examiner*—Ashok Patel
*Attorney, Agent, or Firm*—Heller, Ehrman, White & McAuliffe

[57] ABSTRACT

A microlamp including a polysilicon filament coated with a protective layer and enclosed by a window in a vacuum-sealed cavity.

12 Claims, 9 Drawing Sheets

VACUUM-SEALED SILICON INCANDESCENT LIGHT

BACKGROUND OF THE INVENTION

The present invention relates generally to miniaturized incandescent lamps, and more particularly to a silicon-filament, vacuum-sealed incandescent light source.

Miniaturized incandescent lamps were reported for use in displays in the 1970's. See P.M. Alt, "Performance and design considerations of the thin-film tungsten matrix display," IEEE Trans. Electron Devices, vol ED-20, pp 1006–1015, Nov. 1973; and F. Hochberg, H.K. Seitz, and A.V. Brown, "A thin-film integrated incandescent display", IEEE Trans. Electron Devices, vol ED-20, pp. 1002–1005, Nov. 1973. These devices, which consisted of thin-film tungsten filaments suspended from a glass substrate, were fabricated using hybrid circuit technology. More recently, miniature incandescent light sources have been fabricated utilizing silicon integrated circuit (IC) technology. See H. Guckel and D.W. Burns,"Integrated transducers based on blackbody radiation from heated polysilicon films", Transducers' 85, pp. 364–366, Jun. 11–14, 1985; and G. Lamb, M. Jhabvala, and A. Burgess, "Integrated-circuit broadband infrared source", NASA Tech. Briefs, p. 32, Mar. 1989. In this later work, the incandescent element was an electrically-heated polycrystalline-silicon microbridge resistor elevated a few micrometers above a silicon substrate and exposed to air. Guckel et al. demonstrated the use of this device to make an all-silicon optical coupler.

Even though the polysilicon filaments described in Guckel et al. and Lamb et al are capable of high temperature operation, they are not isolated from the environment, and therefore are susceptible to particle contamination or possibly to damage caused by physical contact. In addition, the useful device life-time is limited by oxidation of the exposed silicon filament when operated in free air. Guckel et al. suggested that the lifetime could be increased if the filaments were coated with silicon nitride to reduce their rate of oxidation.

In view of the foregoing, an object of the present invention is to provide a microlamp in which oxidation and contamination problems are substantially eliminated.

More specifically, an object of the present invention is to provide a vacuum-sealed microlamp.

Additional objects and advantages of the invention will be set forth in the description which follows, and in part will be apparent from the description, or may be learned by practice of the invention. The objects and advantages of the invention may be realized and obtained by means of the instrumentalities and combinations particularly pointed out in the claims.

SUMMARY OF THE INVENTION

The present invention is directed to a microlamp. The microlamp may comprise a substrate having a cavity formed therein. A polysilicon filament may be disposed in the cavity. A window means is provided to vacuum seal the cavity. Radiation emitted by the filament is visible through the window means.

This silicon-filament, vacuum-sealed incandescent light source may be fabricated using IC technology. The incandescent light may include a heavily doped p+ polysilicon filament coated with silicon-nitride and enclosed in a vacuum-sealed ($\approx$ 80 mT) cavity. The filament may be electrically heated to reach a maximum temperature in the range of 1500–1600K corresponding to a peak wavelength of approximately 2 $\mu$m. The power required to achieve this temperature for a filament $350 \times 3 \times 1$ $\mu m^3$ is 3–4 mW. The cavity may be sealed with a silicon-nitride window through which the radiation emitted by the incandescent filament is visible. The turn-off time for the 350 $\mu$m device is 2–4 ms.

BRIEF DESCRIPTION OF THE DRAWINGS

The accompanying drawings, which are incorporated in and constitute a part of the specification, schematically illustrate a preferred embodiment of the invention and, together with the general description given above and the details of the preferred embodiment given below, serve to explain the principles of the invention.

DESCRIPTION OF THE PREFERRED EMBODIMENT

Figure 1:
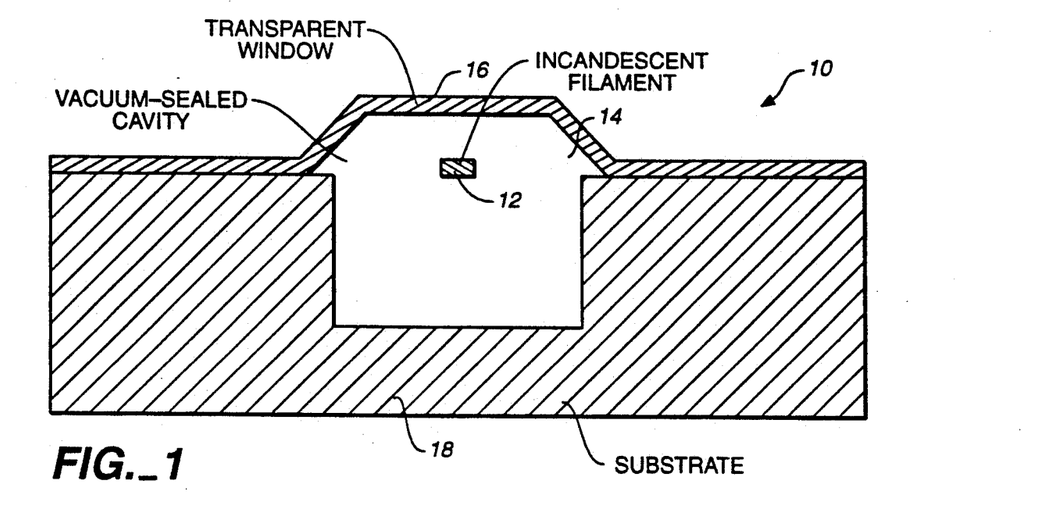
FIG. 1 schematically illustrates a cross-section of a incandescent light source or microlamp in accordance with the present invention.

Referring in detail to the drawings, wherein like reference numerals designate like parts in several figures, and initially to FIG. 1, a vacuum-sealed micro miniature incandescent light source or microlamp 10 in accordance with the present invention is illustrated. As shown, microlamp 10 includes an incandescent filament 12 built inside a vacuum-sealed cavity 14 that is sealed by a window 16. The cavity is formed in a substrate 18. The window 16 transmit the filament black-body radiation with very low loss.

In lamp 10, both oxidation and contamination problems are eliminated. Because the incandescent filament 12 is enclosed in a vacuum environment, it cannot oxidize. Furthermore, window 16 protects the fragile incandescent filament 12 from external contamination or physical disturbance. The lamp can even operate when submerged in liquids.

With silicon nitride used as a window material, it is possible to build active devices such as MOSFETS or bipolar transistors on the same substrate after the process to build the microlamps has been completed. Thus, microlamps can easily be integrated with active circuits.

Refractory materials might be used as filaments in the microlamp or in variations such as the micro-vacuum-amplifying tube. These materials include the refractory metals tungsten, tantalum, platinum, palladium, molybdium, zirconium, titanium, nickel, chromium, nickel-chromium plus, possibly, conducting compounds like the silicides of titanium, zirconium, hafnium, niobium, tantalum, chromium, molybdium, tungsten, iron, cobalt, nickel, platinum, and palladium. Other similar materials are also possible.

In addition to display and optical-coupling applications, the microlamp 10 is suitable for high-efficiency thermal print heads since the filament requires little power to achieve a temperature of 1300K. The silicon-nitride housing provides an excellent wear resistance for contact with paper. The lamp can also be the transmitter for an IC-fabricated optocoupler. The structure has potential biomedical applications that are especially attractive because of the lamp housing and the possibility of operation in liquid environments. It can act as a black-body source for infrared energy, and it can be laid out in planar-array form. If it faced a series of infrared (IR) detectors, this could be very useful for measurements of IR absorption in intervening layers of tissue or other materials.

The technology to produce the microlamp can also be applied to build micromachined vacuum tubes. For example, a micromachined vacuum diode could be fabricated by building both an incandescent cathode filament and a anode inside a single vacuum-sealed chamber. The cathode material should have a low work function and a high carrier density to obtain significant thermionic emission of electrons.

Figure 2:
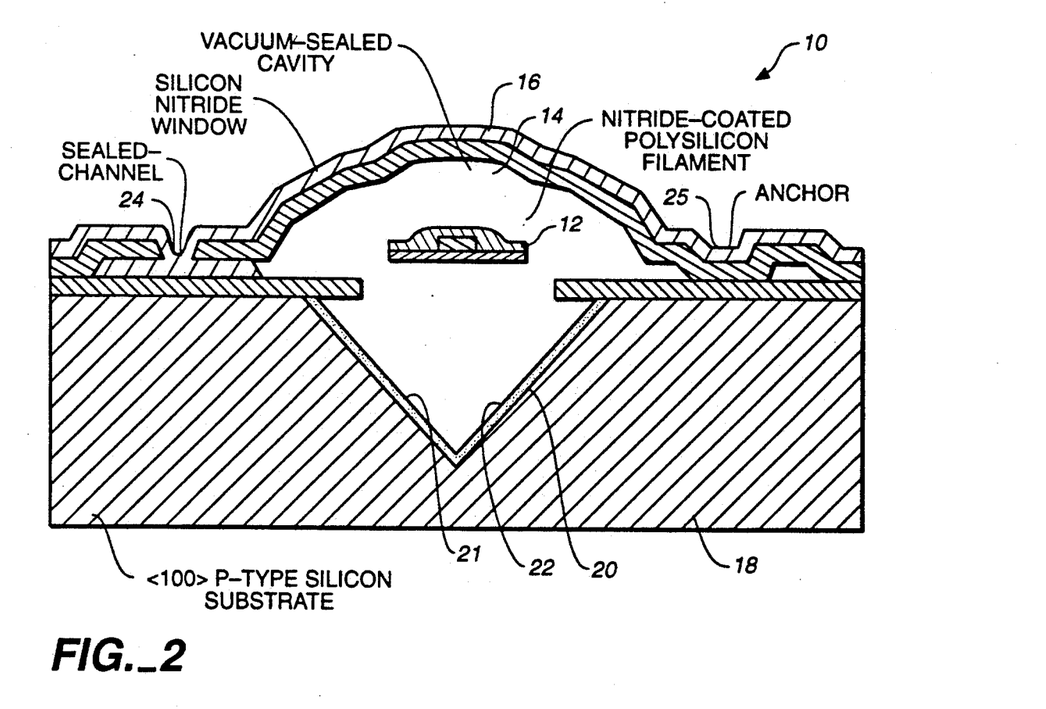
FIG. 2 is a schematic cross-section of an actual incandescent light source in accordance with the present invention.

FIG. 2 shows a cross section of the actual device. In this structure, the incandescent filament 12 is placed between an anisotropically etched silicon V-groove 20 in substrate 18 and a low stress silicon-nitride window 16 that is transparent to the filament black-body radiation. The window hermetically seals the cavity 14 at the time of the deposition of silicon nitride. In this structure, the V-groove silicon walls 21 and 22 are partial reflectors for the filament radiation. The maximum depth of the V-groove is approximately 20 to 25 $\mu m$.

Silicon is transparent for wavelengths longer than 1.1 $\mu m$ reflecting for shorter wavelengths; therefore it is not a good mirror for infrared radiation. The infrared reflectance of the silicon walls can be improved if they are heavily doped. We expect that the wall reflectance can also be improved by the deposition or growth of a thin $SiO_2$ film.

The thermal radiator may be a p+ polysilicon filament. The filament 12 may be coated with low-stress silicon nitride. The conductive polysilicon and insulating silicon-nitride coating may be 0.9 to 1$\mu m$ and 0.3 to 0.5 $\mu m$ thick, respectively. Filament lengths from 110 to 510 $\mu m$ (in 40 $\mu m$ intervals) may be made in a single wafer run. Silicon-nitride coated filaments can operate at higher temperatures than uncoated filaments, since the melting point of silicon nitride is 220K (compared to 1900K for silicon). Thus, even if the silicon filament melts, it is held in place by the silicon-nitride "skin" or protective layer that encloses it.

In operation, the filament is electrically heated until it glows. The maximum achievable temperature is determined by the decomposition rate of silicon nitride and the expected lifetime of the microlamp. Studies conducted on bulk silicon-nitride samples show that the vaporization rate of silicon nitride starts to be significant at 1900K, corresponding to a peak in the spectrum of the emitted radiation of approximately 2$\mu m$.

The window material, silicon nitride, is transparent to wavelengths between 0.28 and 8 $\mu m$. Thus, the window transmits most of the radiation emitted by the incandescent filament. The window must be thick enough to undergo negligible deflection due to the pressure difference between the chamber and the outside environment. A window thickness of 2.5 to 2.8 $\mu m$ is adequate for this purpose.

The cavity seal is achieved by filling lateral etch channels 24 (see also FIG. 3) with additional silicon nitride after the filament has been released and the V-groove etched. A similar sealing technique for an absolute pressure sensor is discussed in S. Sugiyama, T. Suzuki, K. Kawahata, K. Shimaoka, M. Takigawa, and et al., "Micro-diaphragm pressure sensor" Tech. Digest, IEEE International Electron Devices Meeting, pp. 184–187, 1986.

Generally, the channels are completely filled with silicon nitride. The surface of the silicon nitride near the etch-channel seal may be very smooth, and may show no evidence of cracks.

Once the vacuum over the lamp has been sealed, it is straightforward to make MOSFETS or bipolar devices on the same wafer. Therefore, the microlamp can easily be integrated with an active drive circuit.

The microlamp fabrication process is shown in FIGS. 4(a) through 4(k). The process may start with a <100> silicon wafer 30. A thin layer 31 of low-stress silicon-nitride 0.5 $\mu m$ thick may be deposited on the wafer, and it is etched to define the edge of the silicon V-groove. (FIG. 4(a)). The etching is followed by a subsequent deposition of 0.7 $\mu m$ of phosphosilicate glass (PSG) 33 to provide a spacer layer between the filaments and the substrate; thus the silicon etchant can flow underneath the filament once the spacer has been etched. The PSG layer is patterned to conform to the silicon V groove to provide as much planarization as possible, thus precise alignment is needed. (FIG. 4(b). This first silicon-nitride film is not required, and precision alignment is not needed if skipped.

The PSG etch is followed by the deposition of 0.3 $\mu m$ of low-stress silicon-nitride 34 which will form the base of the filament. After the deposition, the residual oxide of the silicon-nitride is removed by an HF dip, and 1 $\mu m$ of undoped polysilicon 35 is grown. The wafer is then ion implanted with boron to make the polysilicon conductive. The ion implant cam be omitted if an in-situ boron-doped polysilicon deposition is performed. (See FIGS. 4(c)).

The polysilicon 35 is then plasma etched, and the residual oxide on the bottom silicon-nitride layer is carefully removed. A 0.3 $\mu m$ layer of low-stress silicon-nitride 36 is subsequently deposited to form the upper part of the filament seal. (FIG. 4(d)). Notice that it is essential to remove the residual oxide of the bottom nitride layer. If the residual oxide is removed, both silicon-nitride layers (top and bottom) will bond. The bond is believed enhanced by the presence of boron from the polysilicon filament. The top and bottom silicon-nitride layers are next patterned to form a silicon-nitride coating around the filament 37 so it is completely sealed. (FIG. 4(e)).

Figure 4A:
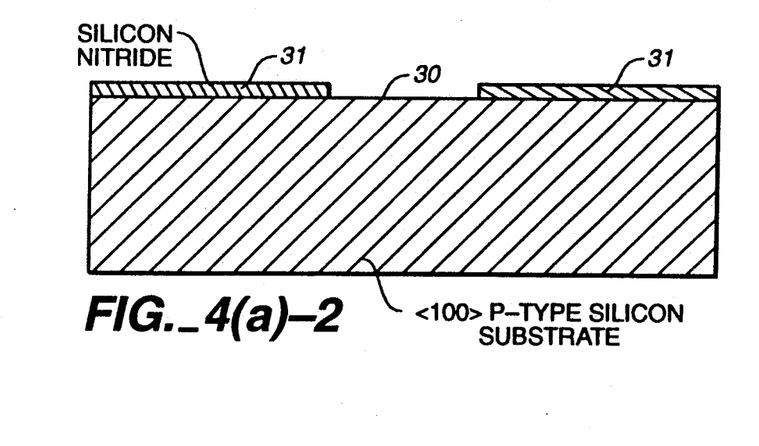
FIGS. 4(a)–4(k) schematically illustrate a microlamp fabrication process according to the present invention. The left-hand figure is a longitudinal view and the right-hand figure is a cross-sectional view of the left-handed figure.
Figure 4A:
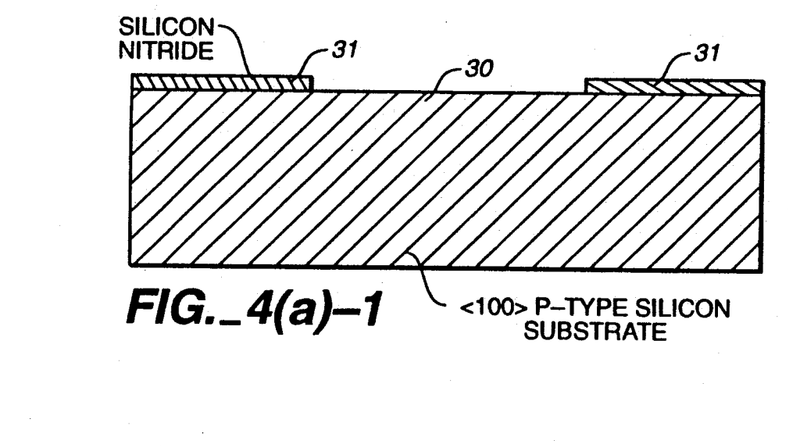
Figure 4B:
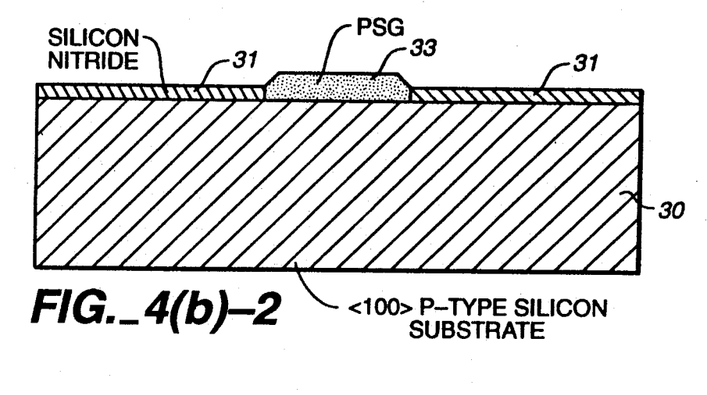
Figure 4B:
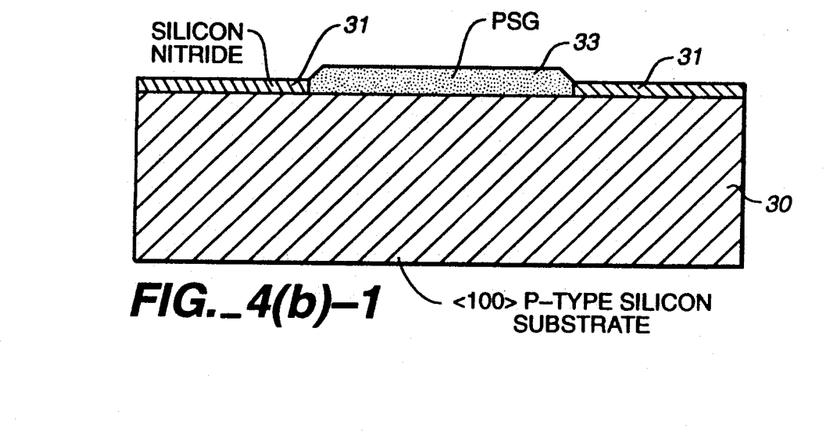
Figure 4C:
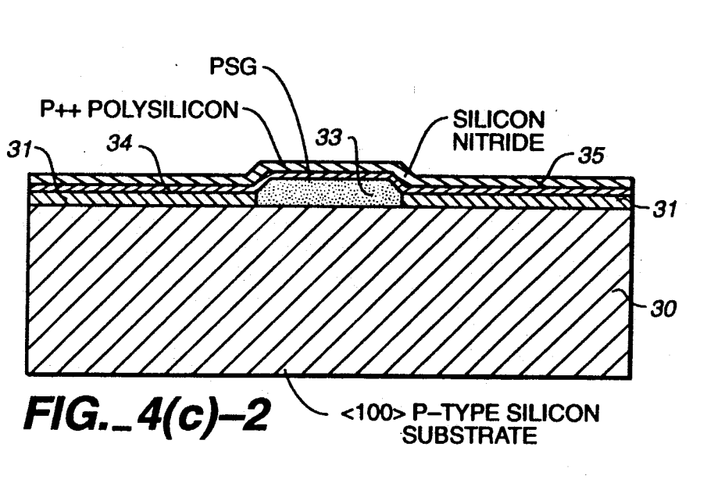
Figure 4C:
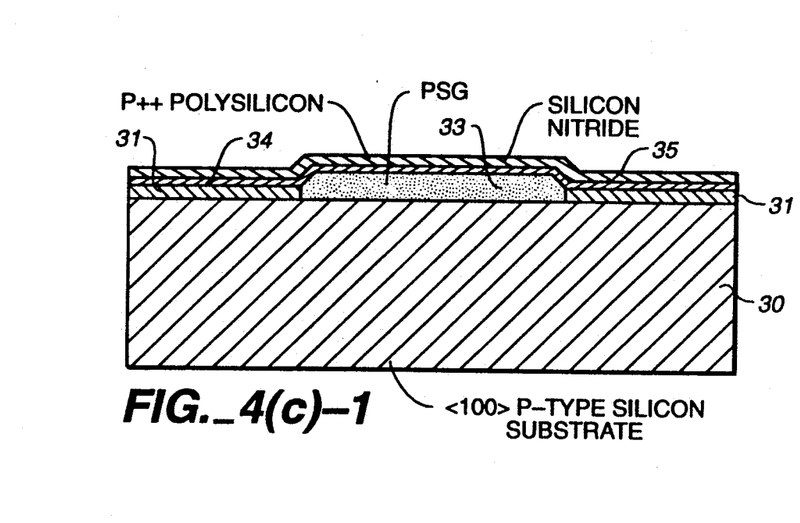
Figure 4D:
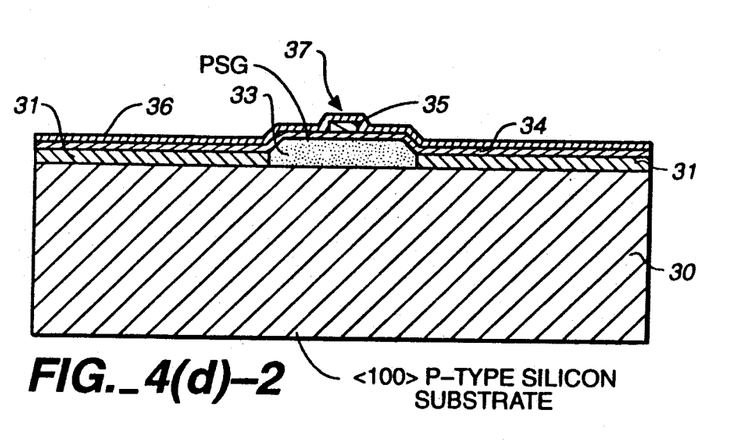
Figure 4D:
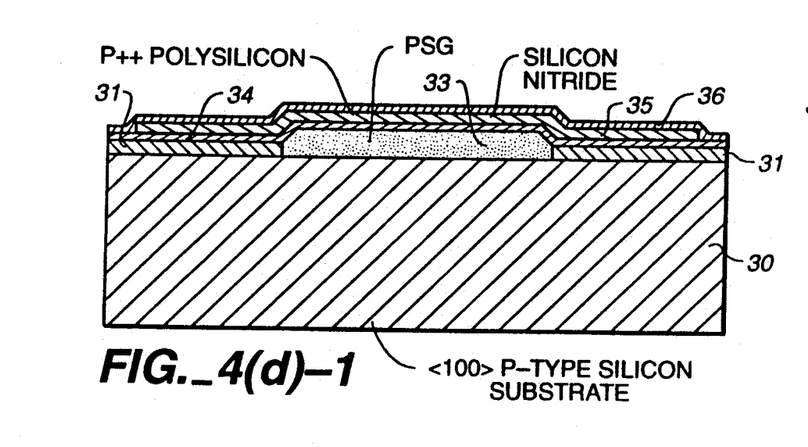
Figure 4E:
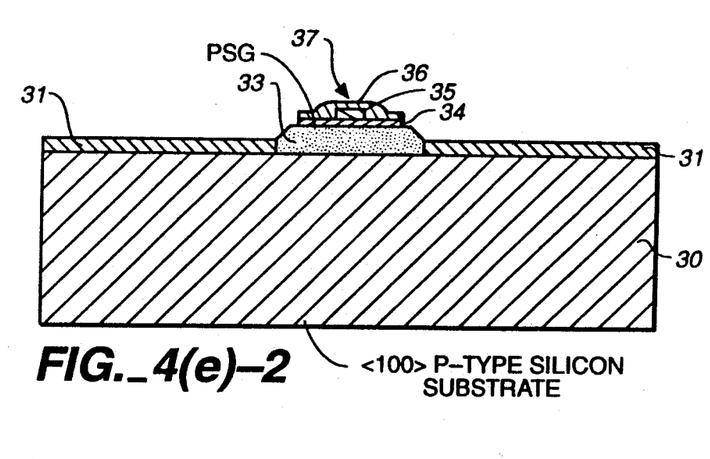
Figure 4E:
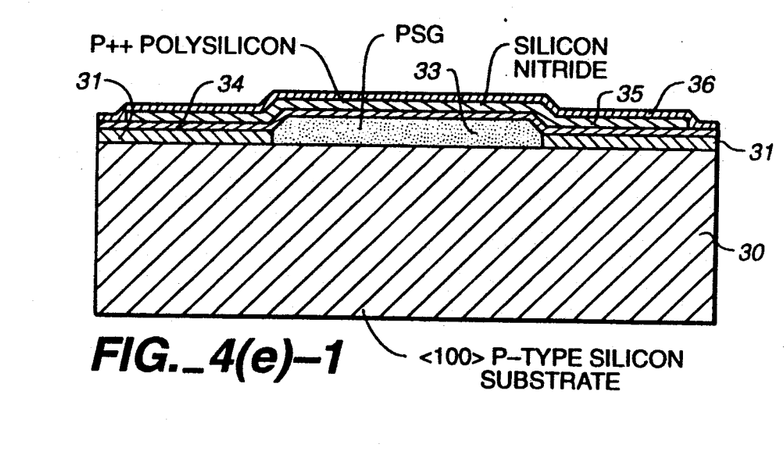
Figure 4F:
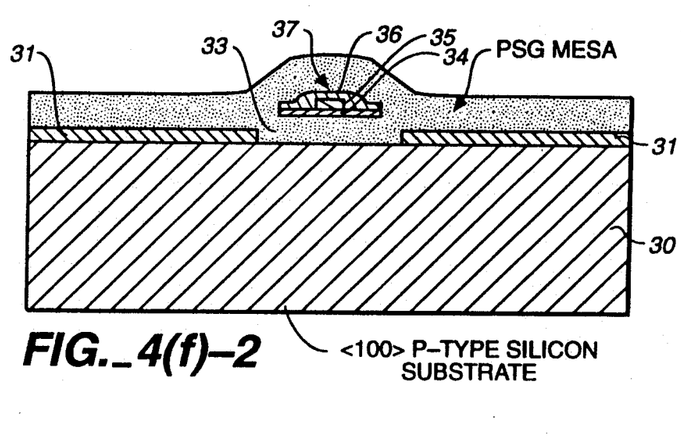
Figure 4F:
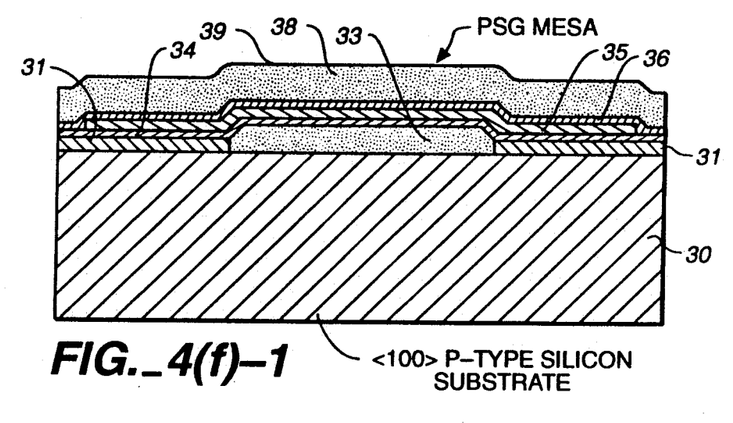
Figure 4G:
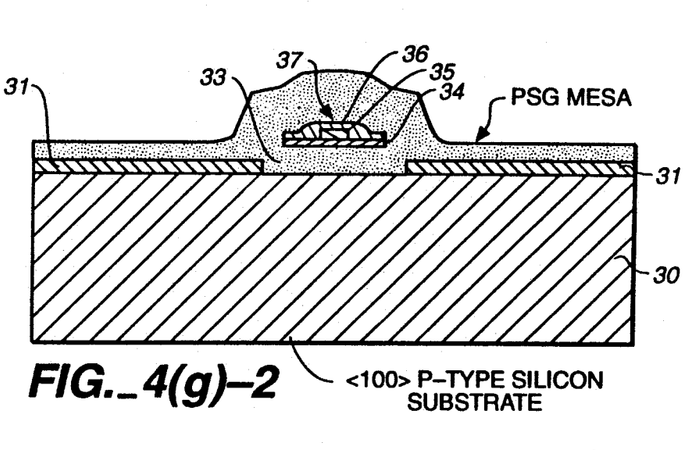
Figure 4G:
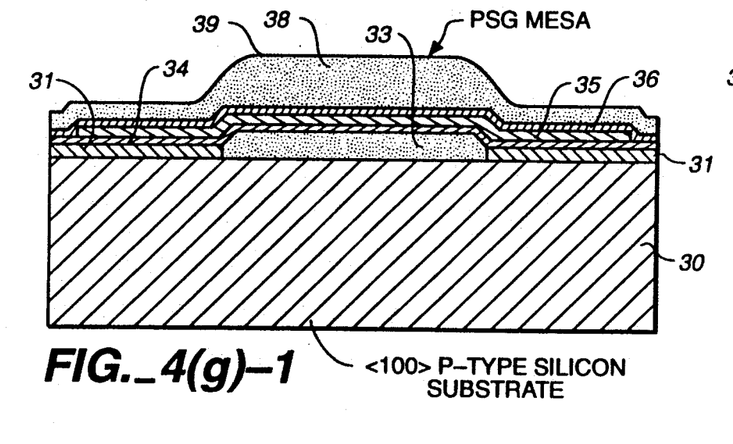
Figure 4H:
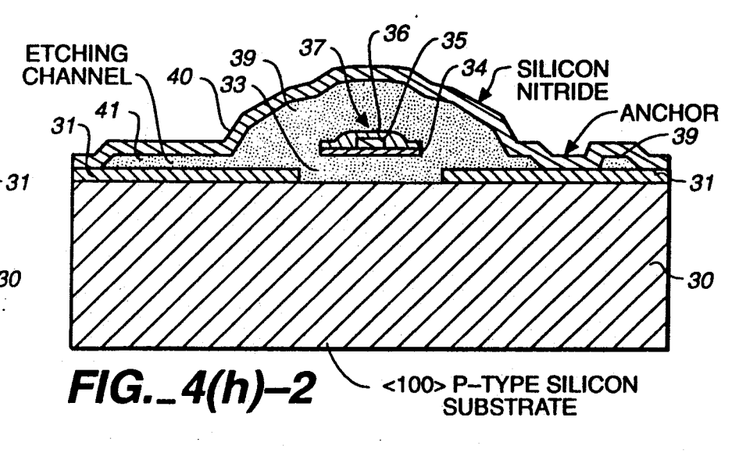
Figure 4H:
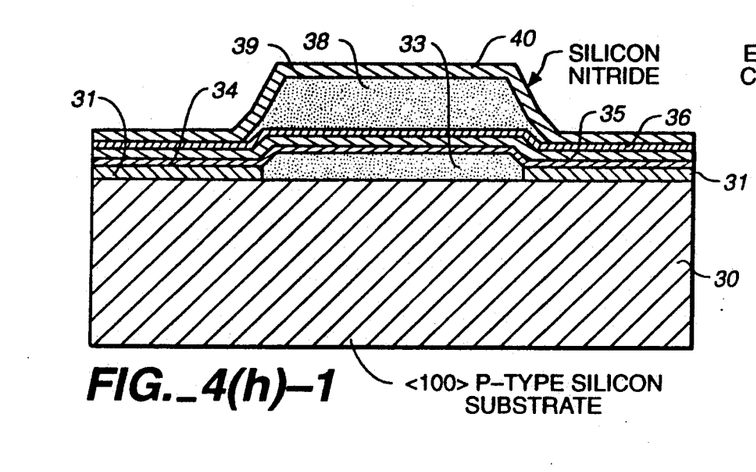
Figure 4I:
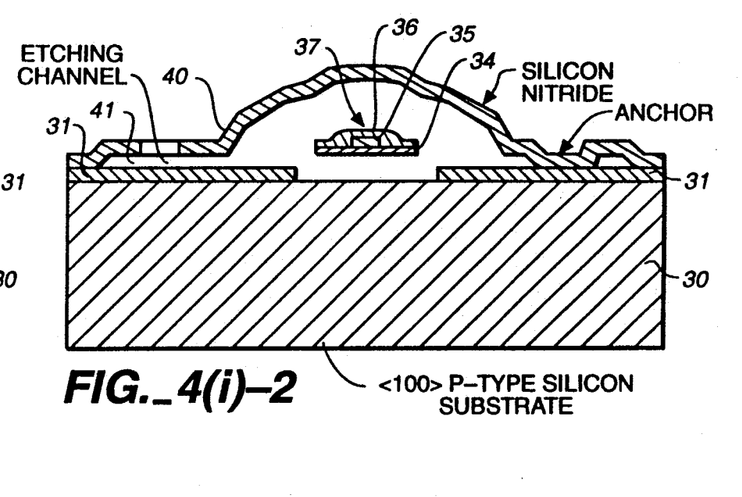
Figure 4I:
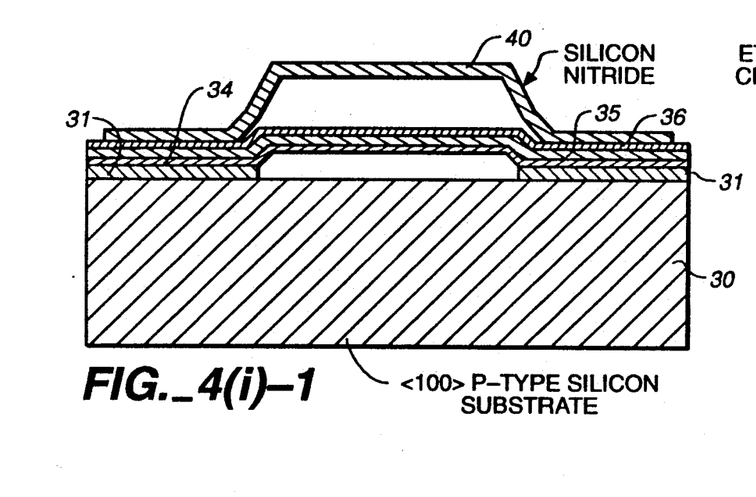
Figure 4J:
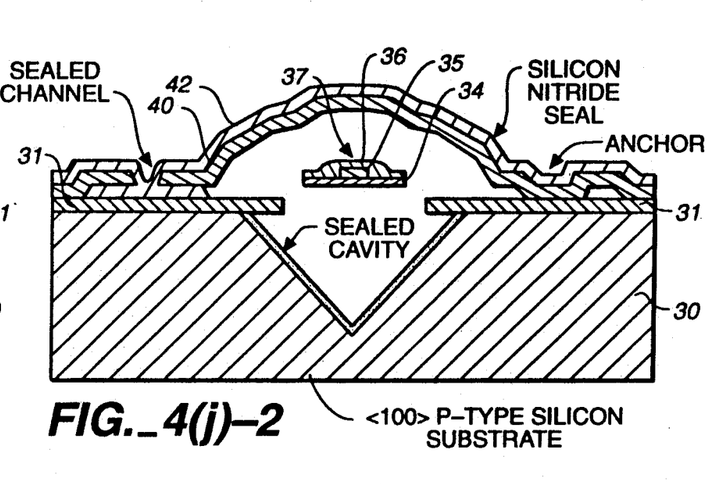
Figure 4J:
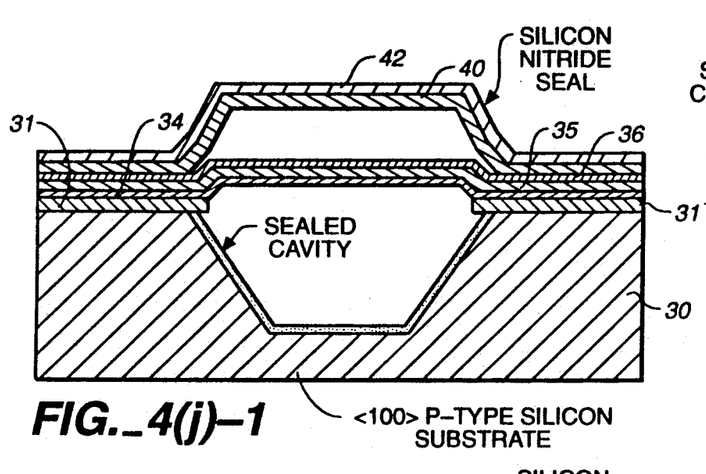
Figure 4K:
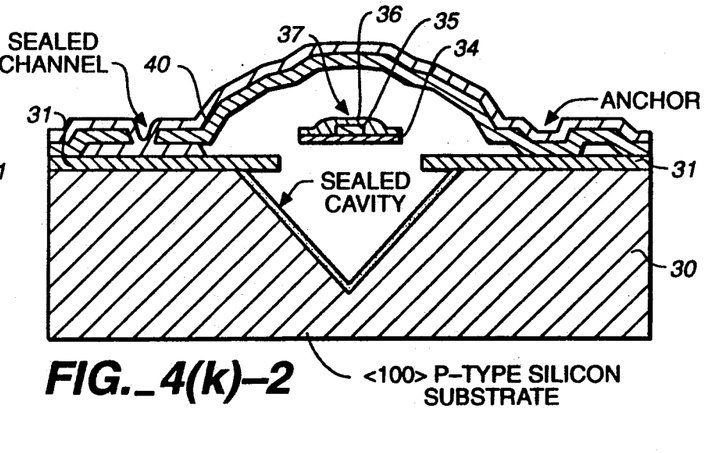
Figure 4K:
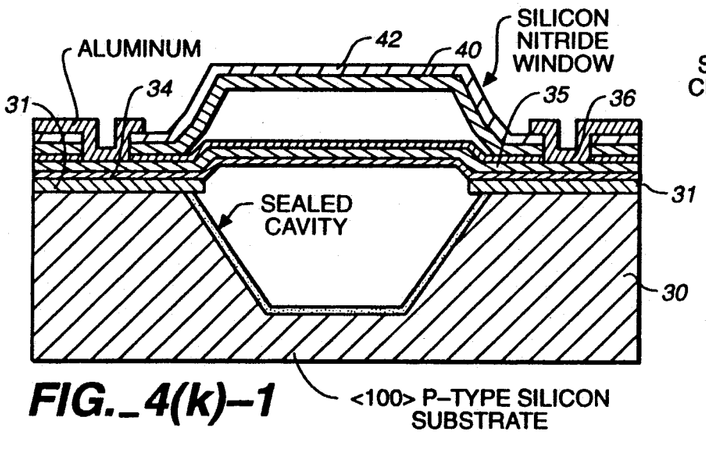

A thick layer 38 of PSG 3 μm thick is then deposited to form a glass mesa on top of the filament 37 (FIG. 4(f)). The wafers are heated at 1050° C. for 30 minutes to activate the filament dopants and to reflow the thick PSG glass. After the reflow, the PSG mesa is etched in buffered HF. The reflow step is necessary to achieve a satisfactory etch of the PSG mesa. If the reflow step is not performed, the wet etchant penetrates the oxide at the interface between the filament and the PSG, thus creating long channels inside the mesa.

After the mesa is formed, a subsequent deposition of 0.8 μm of PSG is performed to form the lateral etching channel. (FIG. 4 (g)). The height of this channel can be reduced. The etching channels may be 0.15 μm high. The etching channel glass is also removed in some regions to provide an anchor for the silicon-nitride window.

After the PSG is etched, any residual oxide on the nitride regions is carefully stripped, and a layer 40 of 1 μm of low-stress silicon-nitride is deposited. (FIG. 4(h)). This layer represents approximately one half of the thickness of the silicon-nitride window. The nitride layer is patterned and etched on the periphery of the V groove, down to the PSG of the etching channel 41. These openings on the nitride are the etching holes leading to the etching channels through which the sacrificial PSG and silicon substrate will be etched.

After the etch holes have been made, the wafer is immersed in concentrated HF for 2.5 minutes to remove the PSG under the silicon-nitride window and underneath the filament. (FIG. 4(i) The wafers are then immersed in a hot, concentration of KOH for 90 minutes to etch the V groove in the silicon substrate.

The wafers or samples are subsequently cleaned, and any residual oxide is removed from the silicon-nitride using HF. An additional layer 42 of silicon-nitride is then deposited, filling the etching holes and hermetically sealing the cavity containing the filament. (FIG. 4(j)). After this step, the contact holes are opened, and the wafers are metalized and sintered. (FIG. 4(k)).

A more detailed description of the microlamp fabrication process is described in the attached Appendix I:

The vacuum-sealed micromachined-silicon infrared source 10 can easily be integrated with MOS or bipolar circuits. The technology demonstrated can be extended to also build a micromachined vacuum tube.

Figure 5:
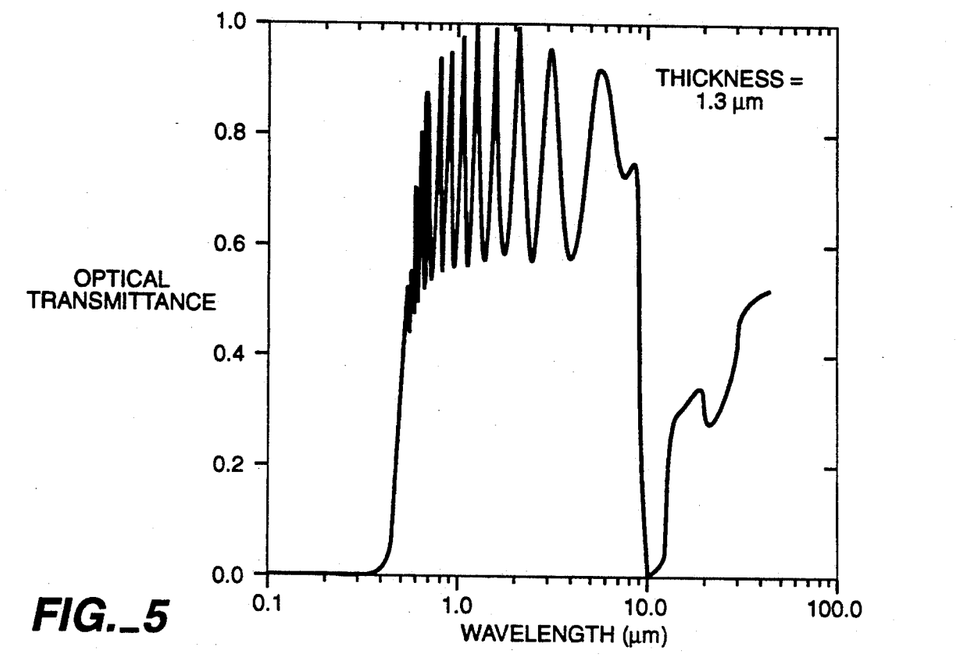
FIG. 5 is, a graphical representation of the measured optical transmission spectrum for a 1.3 $\mu$m thick low-stress silicon-nitride membrane.

Stoichiometric silicon nitride is transparent to radiation with wavelengths between 0.28 and 8 μm. The low-stress nitride window is not stoichiometric having a composition of $Si_{1.0}N_{1.1}$ and a refractive index of 2.4. FIG. 5 shows the optical transmittance of a 1.3 μm-thick low-stress silicon-nitride membrane measured using a FTIR spectrophotometer. The oscillatory nature of the transmittance is caused by interference in the thin membrane. The nitride is transparent between 0.5 to 8 μm; hence it transmits most of the radiation emitted by the incandescent filament. The increase of the lower wavelength absorption edge in the low-stress nitride compared to that of the stoichiometric nitride is expected because of the excess silicon in the film.

Figure 6:
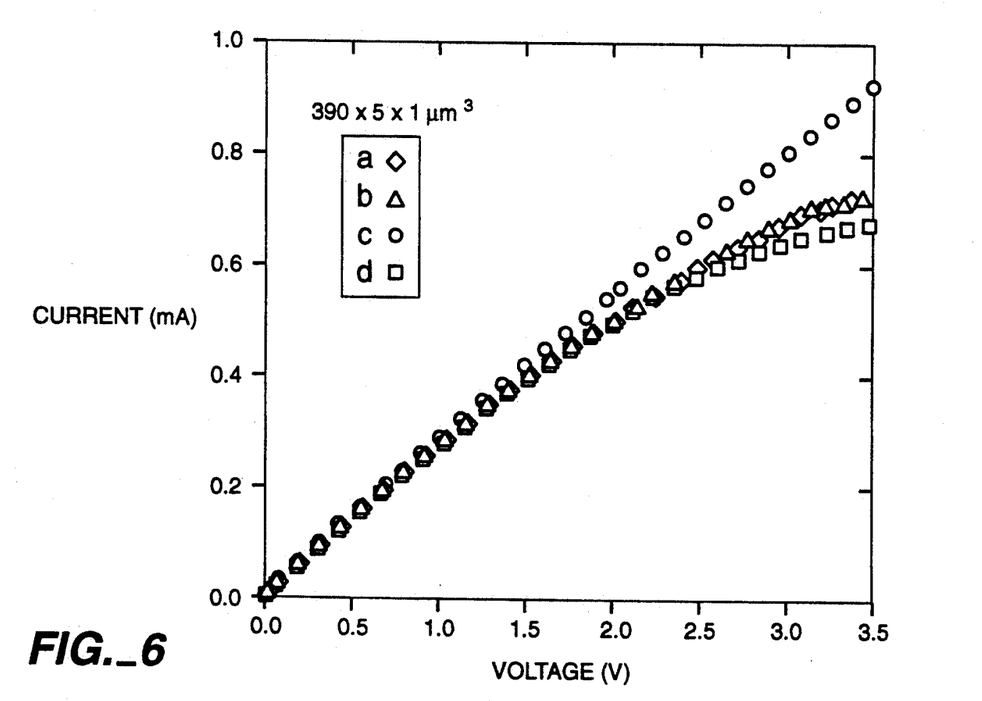
FIG. 6 is a graphical representation of microlamp I-V curves for a sealed microlamp: (a) in a pumped vacuum chamber at 1 atm, (b) in a pumped vacuum chamber at 5 $\mu$T for a punctured microlamp, (c) in a pumped vacuum chamber at 1 atm, and (d) in a pumped vacuum chamber at 5 $\mu$T.

The quality of the nitride seal was tested as follows. First, the low bias I-V curves of a sealed device were measured inside a vacuum system at both atmospheric pressure and at 5 μT. Then the silicon-nitride window was punctured using a fine probe, and the measurements were repeated. FIG. 6 shows the I-V curves for both the sealed and punctured devices. For the sealed microlamps (data points (a) and (b)), there is no dependence in the I-V curves on vacuum system pressure. For the punctured devices, however, the characteristics (data points (c) and (d)) are strongly dependent on vacuum-system pressure. The similarity in the dependence of data points (a), (b), and (d) indicates that the background pressure in the sealed devices is a good vacuum.

Figure 7:
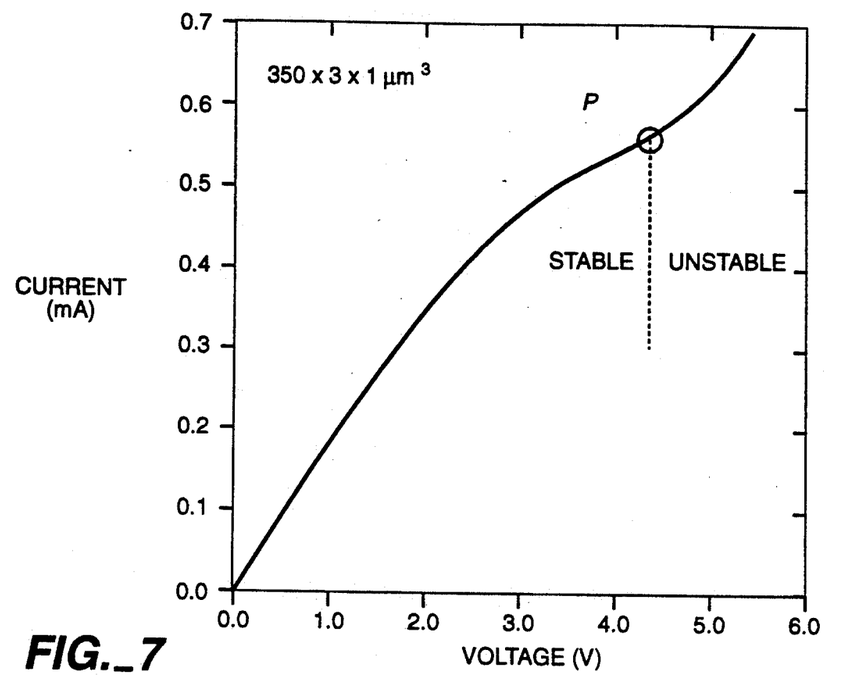
FIG. 7 is a graphical representation of microlamp filament I-V characteristics.

FIG. 7 shows the electrical characteristics of a microlamp device with a polysilicon filament 350 μm long and 5 μm wide. Initially, the device resistance increased since polysilicon has a positive TCR. At higher bias, there is a kink point P where the resistance actually decreases. At this point, the polysilicon filament may have been heated sufficiently to cause thermal breakdown. For voltages higher than those at point P in FIG. 7, the electrical characteristics are irreversible, and the device is typically not operated in this region.

Figure 8:
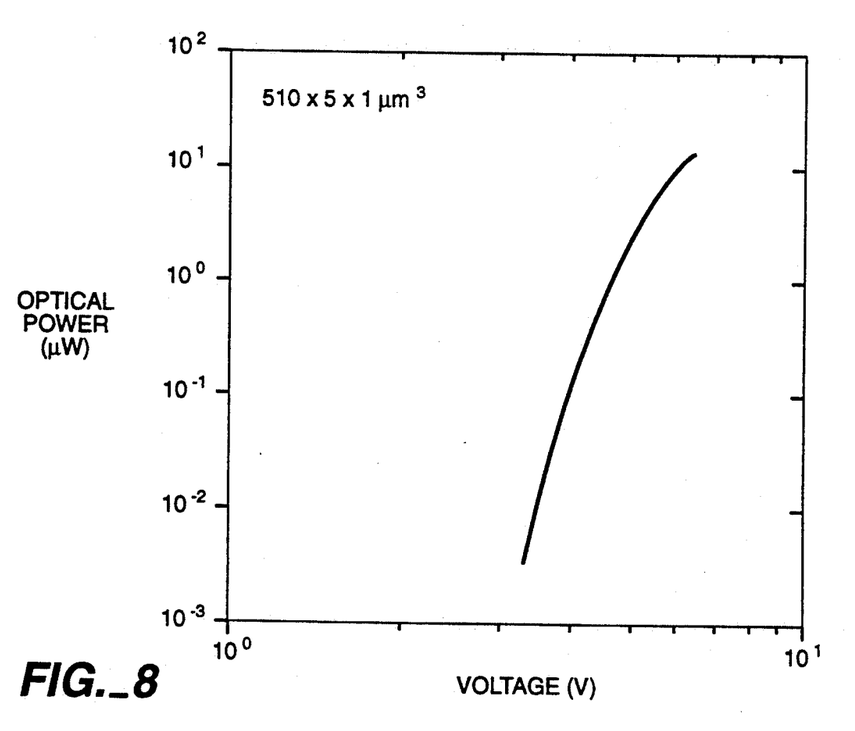
FIG. 8 is a graphical representation of microlamp optical power vis-a-vis applied voltage measured with a pyroelectric detector.

FIG. 8 shows the optical power of a microlamp as a function of the applied bias measured with an optical pyroelectric detector. The point P corresponds to the kink in the I-V characteristic. The radiated power emitted by the incandescent filaments is in the order of μW and clearly visible to the naked eye. The power needed to reach visible incandescence is approximately 5 mW for a 510×5×1 μm³ device.

The time for the filament to cool down from its temperature at incandescence to room temperature has been measured. This time, easily observed by monitoring the near-zero-bias resistance after power is removed from the lamp, depends on the filament length and is typically several ms (for the full transient) for microlamps exceeding 300 μm in length.

Microlamps with polycrystalline-silicon filaments have been built which generate wideband visible and IR light. Typical microlamps operate at 5V and 3mW of power. The measured radiant power is in the order of microwatts.

The use of polycrystalline silicon for the microlamp filament permits the structure to be incorporated in an IC process that is nearly conventional (the low-stress silicon nitride being exceptional). With the incorporation of other metalizations, such as tungsten or tantalum, filaments capable of higher-temperature operation are potentially able to be produced by this technique. Microlamps with these filaments can be expected to operate with much higher optical efficiencies. The IC-processed microlamps, which can be operated in liquids, have many potential applications as wideband infrared and visible radiation sources.

Although demonstrated for the purpose of building microlamp, the fabrication sequence described here can also be used to provide a microvacuum housing for other structures on a silicon substrate. The microlamp of the present invention has a number of applications. For example, in chemical analysis, the wideband spectrum of the lamp is useful to analyze the light absorption of samples. Other potential uses are in displays, infrared scene generation, and the calibration of photosensors.

Although certain embodiments of the invention have been described herein in detail, the invention is not to be limited only to such embodiments, but rather only by the appended claims.

APPENDIX I

1. PREPARATION
   1.1 Wafer Selection : p-type wafer, 18-22 Ω-cm, <100>
2. INITIAL SILICON NITRIDE DEPOSITION 2.1 Standard clean wafers
1. Piranha cleaning (H$_2$SO$_4$:H$_2$O$_2$, 5:1 for 10 min. -sink8
2. 3 DI water rinses, 1 min. each—sink8
3. Wafer drying
4. Steps 1, 2 on sink6, rinse to 8 MΩ-cm
5. Surface oxide removal (mandatory here) (H$_2$O$_2$:HF, 25:1) until hydrophobic, rinse to 12 MΩ-cm - sink6
6. Wafer drying 2.2 Deposit 0.5 μm of low-stress silicon nitride - program SNITC.V, SiCl$_2$H$_2$=75 sccm, NH$_3$=15 sccm at a pressure of 300 mT and a temperature of 835° C. The deposition rate is 3.7 nm/min. T$_{dep}$=136 min.

3. INITIAL SILICON NITRIDE DEFINITION (INE)
3.1 Standard clean wafers
3.2 Standard lithography—layer INE
1. Dehydration bake—VWR oven, 20 min. @ 120° C.
2. HMDS—2 minutes sink5
3. Photoresist spinning and pre-bake. - Eaton program 10, Kodak 820, 4800 rpm. 30 sec., 120° C. 60 sec.
4. Exposure—GCA wafer stepper, T$_{exp}$=0.153s
5. Develop.—MTI program 1, Kodak 932:H$_2$O=1:1, 60 sec.
6. inspection
7. Photoresist descum—Technics-c, 1 min. O$_2$ plasma, 300 mT @ 50 W.
8. Hard bake—VWR oven, 120° C. for 20 min.

4. INITIAL SILICON NITRIDE ETCH
4.1 Plasma etch - LAM2, P=700W, R=3.7 nm/sec., T$_{etch}$=136 sec.
4.2 Standard resist stripping: plasma ash in Technics-c : O$_2$, 300W, 300 mT, 10 min.

5. SPACER 1 PSG DEPOSITION
5.1 Standard clean wafers—sink8, sink6
5.2 PSG deposition, T$_{ex}$=0.7 μm, program SDOLTOD, tylan12, T$_{dep}$=36 minutes.

6. SPACER 1 DEFINITION (LTO1)
6.1 Standard lithography layer LTO1

7. SPACER I PSG ETCH
7.1 PSG etch in fresh 5:1 BHF for 45 sec.
7.2 Photoresist removal and piranha clean.

8. SILICON NITRIDE DEPOSITION
8.1 Standard wafer clean—sink8, sink6 : 1:25 HF dip, 10 sec.
8.2 Low-stress silicon nitride deposition : tylan9, program SNITC.V, SiCl$_2$H$_2$=70 sccm, NH$_3$=15 sccm, at 835° C., P=300 mT. The target thickness is 300 nm. T$_{dep}$=1 hr.

9. POLYSILICON DEPOSITION
9.1 Clean wafers—sink8. 1:10 HF dip 30 sec (mandatory)
9.2 after nitride deposition, deposit 1 μm of undoped polysilicon. tylan11, program SUNPOLYA, T$_{dep}$=86 min.

10. POLYSILICON ION IMPLANTATION
10.1 Blanket implant, B$^{11}$, 50 KeV. dose=1.1×10$^{16}$ cm$^{-2}$.

11. POLYSILICON DEFINITION (NP)
11.1 Standard clean. 1:25 HF dip, 30 sec. (or until dewets)
11.2 Standard lithography—layer NP 12. POLYSILICON ETCH
12.1 Plasma etch poly in LAM1. T$_{etch}$ ≈ 150 sec. Do 50% overetch to remove any polysilicon rings. Test the ring removal using the iv station
12.2 Photoresist removal.

13. SILICON NITRIDE DEPOSITION
13.1 Standard wafer clean—sink8, sink6 : 1:10 HF dip, 30 sec. (mandatory)
13.2 Low-stress nitride deposition : tylan9, program SNITC,V, SiCl$_2$H$_2$=70 sccm, NH$_3$=15 sccm, at 835° C., P=300 mT. The target thickness is 0.3 μm. T$_{dep}$ ≈ 1 hr.

14. SILICON NITRIDE SANDWICH DEFINITION (NIT2)
14.1 Standard lithography—layer NIT2, 2 photoresist layers 15. SILICON NITRIDE SANDWICH ETCH
15.1 Silicon nitride etch, technics-c, P=35W, SF$_4$=13 sccm, He$_2$=21 SCCM. The etching rate is approximately 25-30 nm/min. T$_{etch}$ ≈ 25 min.
15.2 Photoresist removal.

16. SPACER II PSG DEPOSITION
16.1 Standard clean
16.2 Deposit 3.0 μm of phosphosilicate glass. Program SDOLTOD, T$_{dep}$=3.5 hrs. Use a blank control wafer to determine the oxide thickness.

17. SPACER II PSG REFLOW AND IMPLANT ACTIVATION
17.1 Transfer wafers directly to tylan7. Program N2ANNEAL, 30 min @ 1050° C.

18. SPACER II PSG DEFINITION
18.1 Standard lithography—2 layers of photoresist

19. SPACER II PSG ETCH
19.1 Oxide etch—5:1 BHF, sink8, T$_{etch}$ 10-15 min.
19.2 Photoresist removal 20. OXIDE PEDESTAL PSG DEPOSITION
20.1 Standard clean wafers - sink8, sink6
20.2 PSG deposition, T$_{ex}$=0.8 μm. Program SDOLOTD, T$_{dep}$=58 min. Expected thickness is 0.8 μm.

20. OXIDE PEDESTAL DEFINITION (NPED)
21.1 Standard lithography.—Layer NPED, 2 layers (mandatory), overexpose 200%

22. OXIDE PEDESTAL ETCH
22.1 Oxide etch, 5:1 BHF, T$_{etch}$ ≈ 90 sec.

23. SILICON NITRIDE CAP DEPOSITION
23.1 Standard clean wafers—30 sec 10:1 HF dip (mandatory).
23.2 Low-stress silicon nitride deposition, SiCl$_2$H$_2$=70 sccm, NH$_3$=15 sccm @835° C., P=300 mT. The target thickness is 1 μm. T$_{dep}$ ≈ 3.5 hrs.

24. SILICON NITRIDE CAP DEFINITION
24.1 Standard lithography—2 photoresist layers, overexpose 200%, overdevelop 10 sec. using hand development 25. SILICON NITRIDE CAP ETCHING
25.1 Silicon nitride etch LAM2, P=850W, T$_{etch}$=2.5 min, R =0.6 μm/min
25.2 Photoresist removal 26. OXIDE SPACER ETCHING
26.1 Standard wafer cleaning
26.2 Oxide etching, concentrated (49%) HF for 2.5 min 27. SILICON ETCH
27.1 10:1 BHF dip, 1 min
27.2 KOH anisotropic etch @ 80° C., T$_{etch}$≈ 90 min

28. SILICON NUTRIDE VACUUM SEALING DEPOSITION 28.1 Standard wafer cleaning - 10:1 HF dip, 30 sec.
28.2 Low-stress silicon nitride deposition, $SiCl_2H_2=70$ sccm, $NH_3=15$ sccm @ 835° C., P=300 MT. The target thickness is 1 μm. $T_{dep} \approx$ 3.5 hrs.

29. CONTACT HOLE DEFINITION
29.1 Standard lithography—3 layers of photoresist

30. CONTACT HOLE ETCH
30.1 Silicon nitride etch, LAM2, P=850W, R=0.6 μm/min. Measure the conductivity of the contact opening in the iv probe to detect the endpoint, $T_{etch} \approx 4.5$ min 31. METALIZATION
31.1 Standard wafer cleaning—10:1 HF dip, 30 sec.
31.2 Dehydrate water—120° C. oven
31.3 Residual oxide removal, LAM2, P=700W, $T_{etch}=15$ sec.
31.4 Metal sputtering—cpa, Al-Si target, P=4.5 kW, Ar=120 sccm, P=6mT, track speed=8 μcm/min. Expected thickness is 0.9 μm.

32. METAL DEFINITION (NM)
32.1 Standard lithography—Layer NM, 2 photoresist layers, Texp $\approx$ 25% less.

33. METAL ETCH
33.1 Al etch—Sink8, Al etchant type A. ($H_3PO_4$:H-$C_3O_2H$) $\approx$
45° C., $T_{etch} \approx$ 90 sec.
33.2 Silicon etch dip—15 sec.

34. SINTERING
34.1 Program SINT460, tylan 13, 450° C. for 20 min.

35. END PROCESS

What is claimed:
1. A microlamp, comprising:
a substrate;
a cavity formed in said substrate;
a polysilicon filament coated with a protective layer disposed in said cavity; and
a window means for vacuum sealing said cavity wherein radiation emitted by said filament is visible through said window means.

2. The microlamp of claim 1 wherein said protective layer is a silicon-nitride coating.

3. The microlamp of claim 2 wherein said window means is silicon nitride.

4. A microstructure comprising:
a substrate having a groove;
sealing means disposed over said groove to form a sealed cavity;
a filament suspended in said cavity, the ends of said filament connected to the sides of said cavity; and
means for heating said filament to cause said filament to produce radiation.

5. The microstructure of claim 4 wherein said filament is polysilicon.

6. The microstructure of claim 4 wherein said filament is a refractory metal.

7. The microstructure of claim 6 wherein said refractory metal is selected from the group consisting of tungsten, tantalum, platinum, palladium, molybdenum, zirconium, titanium, nickel and chromium.

8. The microstructure of claim 4 wherein said filament is coated with a protective layer.

9. The microstructure of claim 8 wherein said protective layer is silicon nitride.

10. The microstructure of claim 4 wherein said sealing means includes a window through which radiation from said filament may pass.

11. The microstructure of claim 4 wherein said radiation is electrons.

12. The microstructure of claim 4 wherein said filament is between 110 μm and 550 μm in length.

* * * * *

UNITED STATES PATENT AND TRADEMARK OFFICE
CERTIFICATE OF CORRECTION

Figure 3:
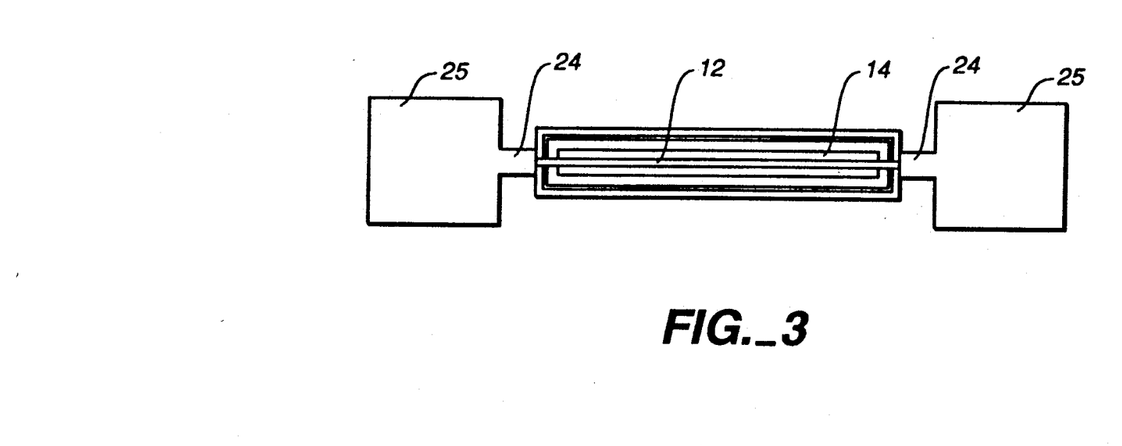
FIG. 3 is a schematic plan view of an incandescent light source in accordance with the present invention.

PATENT NO. : 5,285,131
DATED : February 8, 1994
INVENTOR(S) : Richard S. Muller et al It is certified that error appears in the above-indentified patent and that said Letters Patent is hereby corrected as shown below:

Drawings, sheet 2, Fig. 3, delete reference numerals 24 and the corresponding lead lines.
Column 2, line 39 delete "for a punctured microlamp".
Column 2, line 40, after "atm" insert --for a punctured microlamp--.
Column 2, line 41, after "$\mu$T" insert --for a punctured microlamp--.
Column 2, line 58 replace "transmit" with --transmits--.
Column 3, line 11 replace "molybdium" with --molybdenum--.
Column 3, line 33 replace "a" with --an--. (1st occur.)
Column 3, line 48 insert --and-- between "$\mu$m" and "reflecting".
Column 3, line 62 replace "220K" with --2200K--.
Column 4, line 15 delete "(see also FIG. 3)".
Column 5, line 32 replace "concentration" with --concentrated solution--.
Column 5, line 42 replace "Appendix I:" with --Appendix I.--.
Column 6, line 50 add --a-- after "building".

Signed and Sealed this

Twentieth Day of September, 1994

Attest:

BRUCE LEHMAN

Attesting Officer

Commissioner of Patents and Trademarks